United States Patent
Scholten

(10) Patent No.: US 6,986,086 B2
(45) Date of Patent: Jan. 10, 2006

(54) METHOD AND DEVICE FOR SIMULTANEOUS TESTING OF A PLURALITY OF INTEGRATED CIRCUITS

(75) Inventor: Gerd Scholten, München (DE)

(73) Assignee: Infineon Technologies AG, Munich (DE)

(*) Notice: Subject to any disclaimer, the term of this patent is extended or adjusted under 35 U.S.C. 154(b) by 445 days.

(21) Appl. No.: 10/190,042

(22) Filed: Jul. 5, 2002

(65) Prior Publication Data
US 2004/0006728 A1  Jan. 8, 2004

(30) Foreign Application Priority Data
Jul. 3, 2001  (DE) .................. 101 32 159

(51) Int. Cl.
*G01R 31/28* (2006.01)
(52) U.S. Cl. .................... 714/724; 714/718
(58) Field of Classification Search ............. 714/731, 714/727, 724, 738, 726, 707, 712, 718, 744; 716/4
See application file for complete search history.

(56) References Cited

U.S. PATENT DOCUMENTS

| 5,260,949 | A  | * | 11/1993 | Hashizume et al. ........ 714/731 |
| 6,081,916 | A  | * | 6/2000  | Whetsel, Jr. ................ 714/727 |
| 6,304,987 | B1 | * | 10/2001 | Whetsel, Jr. ................ 714/724 |
| 6,311,300 | B1 |   | 10/2001 | Omura et al. |
| 6,370,665 | B1 | * | 4/2002  | Noguchi ..................... 714/738 |
| 6,578,180 | B2 | * | 6/2003  | Tanner ........................... 716/4 |
| 6,618,827 | B1 | * | 9/2003  | Benavides ................. 714/726 |

FOREIGN PATENT DOCUMENTS

DE           198 53 069 A1     1/2000

* cited by examiner

*Primary Examiner*—Albert Decady
*Assistant Examiner*—Fritz Alphonse
(74) *Attorney, Agent, or Firm*—Laurence A. Greenberg; Werner H. Stemer; Ralph E. Locher

(57) ABSTRACT

An inventive device for simultaneous testing of a plurality of integrated circuits is described. Each integrated circuit of the plurality of integrated circuits includes a test mode, wherein a test sequence is executed in the integrated circuits, as well as a pin for outputting test data produced in the test mode. The device includes a plurality of test interfaces adapted to be connected with the pin of the plurality of integrated circuits, for receiving the test data of the plurality of integrated circuits, an interface adapted to be connected to a synchronization interface of an integrated reference circuit, wherein a test sequence is executed which is identical with the test sequence of the plurality of integrated circuits, for receiving a synchronization signal which is synchronous with the test sequence, and synchronization means for synchronizing the simultaneous testing on the basis of the synchronization signal of the integrated reference circuit.

4 Claims, 2 Drawing Sheets

METHOD AND DEVICE FOR SIMULTANEOUS TESTING OF A PLURALITY OF INTEGRATED CIRCUITS

FIELD OF THE INVENTION

The present invention relates to testing integrated circuits and in particular to simultaneous testing of a plurality of integrated circuits having a test mode in which a test sequence is executed in the integrated circuits.

BACKGROUND OF THE INVENTION AND PRIOR ART

In the tests and measurements performed on integrated circuits it is desirable, for reasons of cost, to be able to simultaneously test as many integrated circuits as possible with one given test setup. In order to reduce the test expense for simultaneous testing of a plurality of integrated circuits, the integrated circuits are frequently designed such that they are switchable in a test mode wherein a test sequence is executed at least partially autonomously in the integrated circuit, and wherein the number of pins, or pads, required for the test is limited per integrated circuit. Due to the fact that the test sequences are executed at least partially autonomously in the integrated circuits, however, a synchronization with the external test setup is necessary.

Various methods are possible for synchronizing the test sequences with the external test setup. One possibility is to operate the integrated circuits to be tested and the test setup with a clock shared by them, and to track the execution of the clock sequence in the integrated circuits by a clock counter in the test setup. In order to be able to track the test sequence in the integrated circuits, it must be known, for the test setup, after how many clocks the integrated circuits are in which state, wherein all test modes of the integrated circuits must be checked for the number of clocks required prior to their use in the test.

A further possibility of synchronization is that the integrated circuits comprise a specific synchronization pin outputting a signal to the test setup at desired points in time. To this end, the external test setup must consequently have a test interface for the synchronization pin of each integrated circuit to be tested so as to be connected to same. In addition, the external test setup must check whether the synchronization signal being sent is faulty, while it is taken into account that individual ones of the integrated circuits to be tested may be defect and therefore do not send any synchronization signal at all or do not send a permanent one.

A further possibility for synchronizing the external test setup with the integrated circuits to be tested is that the integrated circuits to be tested also have a synchronization pin connected to the test setup, and send a specific protocol to the external test setup via same, from which protocol the synchronization may be derived. This solution for synchronization, however, limits the flexibility of the data transfer and prolongs transfer time. As is also the case in the previous approach, the test setup must further verify the specific protocol sent of each integrated circuit to be tested for any faultiness so as to take into account the possibility of defect integrated circuits.

FIG. 2 shows a test arrangement wherein each integrated circuit to be tested has a synchronization pin, and wherein the synchronization pin of each integrated circuit to be tested, or of each integrated device to be tested (DUT= device under test) 300, 302, 304, 306, 308, 310, 312 and 314 is connected to an external test setup 316. Each integrated circuit to be tested 300–314 is represented in an exemplary manner so as to comprise a terminal Vcc1 for receiving a supply voltage, a terminal GND so as to be connected to ground, and three terminals a1, a2 and a3, which, during the test mode of the integrated circuits 300–314, output the test data produced during the test mode and, if need be, receive data from the external test setup 316. In addition, each integrated circuit to be tested 300–314 has a synchronization pin a4 where a synchronization signal is output which is synchronous with the test sequence executed during the test mode. The test setup 316 includes a plurality of test interfaces 318, 320, 322, 324, 326, 328, 330, and 332, each of which is connected to the three test pins a1–a3 of an integrated circuit to be tested 300–314. Further the external test setup 316 includes a plurality of interfaces 334, 336, 338, 340, 342, 344, 346, and 348, each of which is connected to the synchronization pin a4 of an integrated circuit to be tested 300–314.

During a simultaneous test of the eight integrated circuits 300–314, the external test setup 316 puts each of the integrated circuits 300–314 in a test mode, wherein the integrated circuits 300–314 output test data at the pins a1–a3, which is produced during a test sequence executed on them, and output synchronization signals at the synchronization pin a4, which signals are synchronous with the test sequence. The test setup 316 receives the test data at the test interfaces 318–332 and evaluates them in a suitable manner. For synchronizing the evaluation with the test sequences executed on the integrated circuits 300–314, the test setup 316 uses the eight synchronization signals which it receives at the interfaces 334–348. The test setup 316 must carry out a check for each synchronization signal to see whether the synchronization signal has been produced by a defect or a functional integrated circuit 300–314.

SUMMARY OF THE INVENTION

It is the object of the present invention to provide a method and a device for simultaneous testing of a plurality of integrated circuits, which reduce the test expense.

In accordance with a first aspect of the invention, this object is achieved by a method for simultaneous testing of a plurality of integrated circuits, each of which comprises a test mode wherein a test sequence is executed in the integrated circuits, and a pin for outputting test data produced in the test mode, includes receiving the test data of the plurality of integrated circuits at a plurality of test interfaces adapted so as to be connected to the pin of the plurality of integrated circuits, receiving a synchronization signal, which is synchronous with the test sequence, at an interface adapted to be connected to a synchronization interface of an integrated reference circuit wherein a test sequence is executed which is identical with the test sequence of the plurality of integrated circuits, and synchronizing the simultaneous testing on the basis of the synchronization signal of the integrated reference circuit.

In accordance with a second aspect of the invention, this object is achieved by a device for simultaneous testing of a plurality of integrated circuits, each of which has a test mode, wherein a test sequence is executed in the integrated circuits, and a pin for outputting test data produced in the test mode, includes a plurality of test interfaces adapted to be connected to the pin of the plurality of integrated circuits, for receiving the test data of the plurality of integrated circuits, an interface adapted to be connected to a synchronization interface of an integrated reference circuit, wherein a test sequence is executed which is identical with the test sequence of the plurality of integrated circuits, and a synchronization means for synchronizing simultaneous testing on the basis of the synchronization signal of the integrated reference circuit.

The present invention is based on the findings that the provision of synchronization pins at the integrated circuits to be tested as well as the provision of corresponding test interfaces at the external test setup may be dispensed with and that the checking whether a synchronization signal comes from a defect or a functional integrated circuit to be tested may be saved when, for synchronizing the test operation of the external test setup with the test sequences of the plurality of integrated circuits to be tested, use is made of the synchronization signal of an integrated reference circuit wherein a test sequence identical with the test sequence of the plurality of integrated circuits is executed. In this manner, the expense for synchronization is reduced to providing an interface adapted to be connected to the synchronization interface of the integrated reference circuit.

The integrated reference circuit may be an integrated circuit which is identical with the plurality of integrated circuits and which previously has been checked for its functionality, so that a verification of the synchronization signal in the simultaneous tests of the integrated circuits to be tested is omitted.

On the whole the external test setup, or the device for simultaneous testing of the plurality of integrated circuits to be tested is simplified with regard to the number of pins to be connected to the test setup and with regard to the protocol of the data transfer between the integrated circuits and the test setup.

BRIEF DESCRIPTION OF THE DRAWINGS

In the following, preferred embodiments of the present invention will be explained in more detail with reference to the accompanying drawings, wherein.

DETAILED DESCRIPTION OF THE PREFERRED EMBODIMENTS

Figure 1:
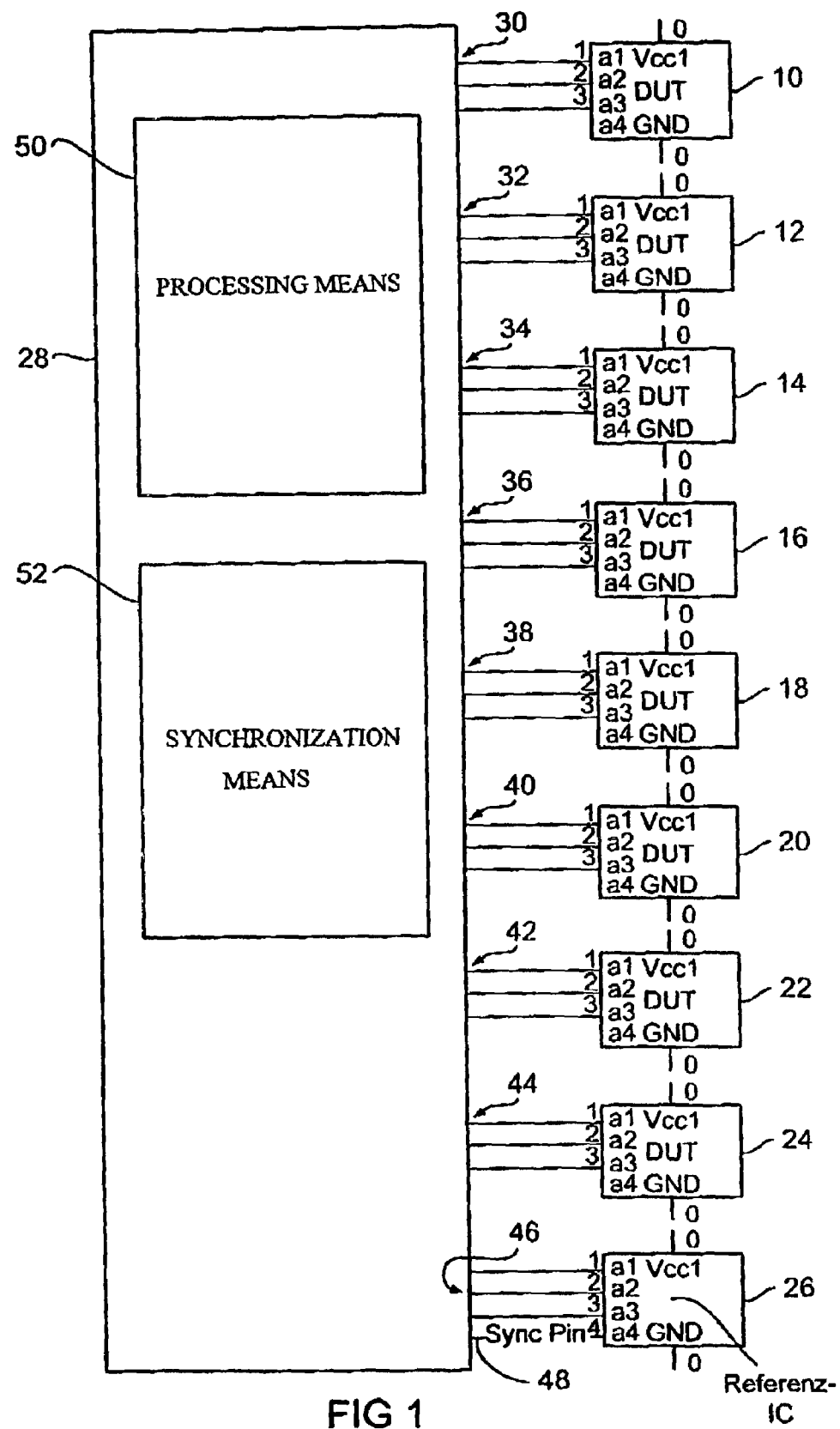
FIG. 1 is a block diagram showing a test arrangement in accordance with an embodiment of the present invention.
Figure 2:
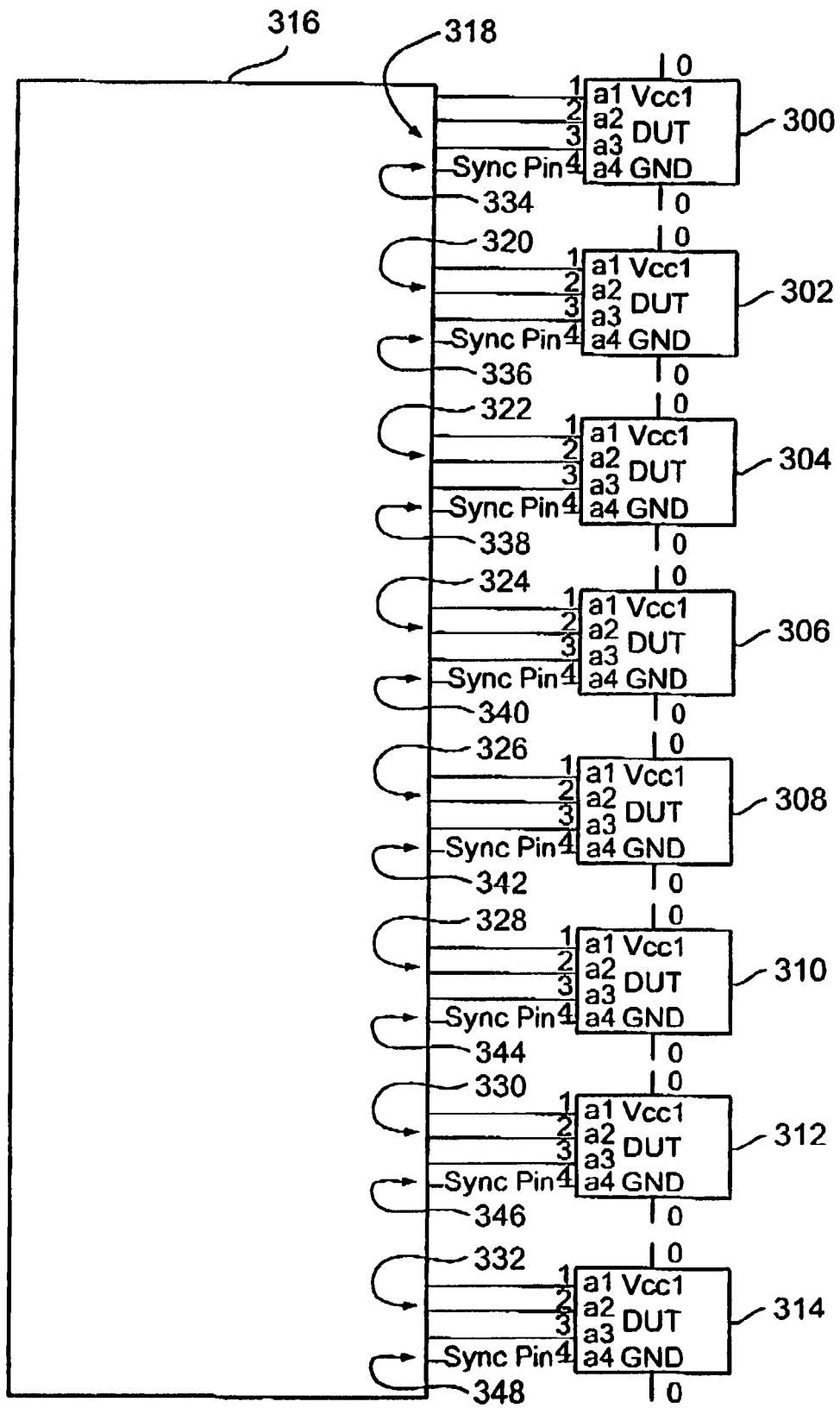
FIG. 2 is a block diagram showing a test arrangement wherein the synchronization pin of each integrated circuit to be tested is connected.

With reference to FIG. 1, a test arrangement in accordance with an embodiment of the present invention will be described below, in which test arrangement eight integrated circuits to be tested are tested simultaneously by a test device, the synchronization of the test sequences being executed on the integrated circuits with the test execution within the test device being achieved by a synchronization signal obtained from an integrated reference circuit.

FIG. 1 shows eight integrated circuits to be tested 10, 12, 14, 16, 18, 20, 22, and 24 as well as an integrated reference circuit 26, each of these integrated circuits 10–26 being equal in construction, or supporting a test mode in which one or several identical test sequences are executed on same. Each integrated circuit 10–26 includes a pin Vcc1 for receiving the supply voltage, a pin GND so as to be connected to ground, three pins a1, a2, a3 for outputting test data produced during the test sequence which is being executed, and, if need be, for receiving data, and a synchronization pin a4 for outputting a synchronization signal which is synchronous with the test sequence being executed on the respective integrated circuit 10–26.

A test device 28 includes nine test interfaces 30, 32, 34, 36, 38, 40, 42, 44, and 46, each of which is connected to the three pins a1–a3 of a respective integrated circuit 10–26. In addition the test device 28 further includes an interface 48 connected to the synchronization pin a4 of the integrated reference circuit 26, as well as processing means 50 and synchronization means 52.

The test device 28 may further include other components, such as, for example, a voltage supply and an oscillator, which, however, are not shown in FIG. 1 for reasons of clarity.

The mode of operation of the test device 28 will be described below. During the test execution for simultaneous testing of the integrated circuits 10–24 the test device 28 activates a test mode provided by the integrated circuits 10–24 and by the integrated reference circuit 26, in which test mode a test sequence or several test sequences are executed. The test mode, or the test sequences of each integrated circuit 10–24 and of the integrated reference circuit 26 are activated simultaneously by the processing means 50 or by a test execution program executable on same, so that the test sequences of the integrated (reference) circuits 10–26 are executed in parallel, i.e. synchronously. The activation may be effected, for example, by sending suitable activation signals to one or several of the pins a1–a3.

Upon activation of the test mode, certain test sequences are executed in a synchronous manner in the integrated circuits to be tested 10–24 and in the integrated reference circuit 26, the integrated reference circuit 26 outputting synchronization signals which are synchronous with the test sequence.

The test data received by the test device 28 from the integrated circuits 10–24 and from the integrated reference circuit 26 via the test interfaces 30–46 is processed and evaluated by the processing means 50 or the program executed on same. For synchronizing the evaluation or the processing means 50, the synchronization means 52 uses only the synchronization signal of the integrated reference circuit 26. Accordingly, only the synchronization pin a4 of the integrated reference circuit 26, but not the synchronization pins a4 of the integrated circuits to be tested 10–24 is connected to the test device 28.

In the present case the integrated reference circuit 26 is a circuit which is identical with the integrated circuits 10–24 but which, however, has been tested for its functionality before the execution of the test. However, the integrated reference circuit 26 may also differ from the integrated circuits to be tested 10–24 as long as the test sequence being executed is identical with those being executed on the integrated circuits to be tested 10–24. Thus it is not required, for example, that the synchronization pin a4 for outputting the synchronization signal be provided in the layout of the integrated circuits to be tested 10–24, but same may rather be missing or be existing only in the integrated reference circuit 26. Due to the fact that the functionality of the integrated reference circuit 26 has already been checked, it is not required for the test device 28 to verify the synchronization signals from the integrated reference circuit 26. In addition, it is also not necessary for the test device 28 to evaluate the test data from the integrated reference circuit 26 within the framework of the test execution, since same has already been verified for its functionality. Consequently, the test interface 46 of the test device 28 may be missing, or the pins a1 to a3 of the integrated reference circuit 26 may be missing.

After the test device 28 has been described above in accordance with an embodiment of the present invention it shall be pointed out that the number of the integrated circuits to be tested is random and is not limited to eight. In addition, the number of pins on which the test data is output, and which number depends on the test mode, is arbitrary. With regard to the integrated reference circuit 26 it shall be pointed out that the test interface 46 and the interface 48, which serve for connecting the integrated reference circuit 26 to the test device 28, may be arranged so as to be external of the test device 28 or internal of same.

Consequently, the test device 28 shown in FIG. 1 makes it possible that the synchronization pin of the integrated circuits to be tested need not be used and need not be connected for the common, i.e. simultaneous test. Instead, a known intact integrated circuit, i.e. a functional one, is additionally integrated in the test setup. This integrated reference circuit, or "golden device", is put in the test mode in a manner which is synchronous with the integrated circuits to be tested. The test data of the integrated reference circuit need not be evaluated. The synchronization pin not used with the integrated circuits to be tested remains unconnected, while the synchronization pin of the integrated reference circuit is used for synchronization with the test device.

Consequently, only one synchronization pin in total, i.e. that of the integrated reference circuit, is required for any number of integrated circuits to be tested. Further the test device dispenses with the necessity of making a decision as to whether the synchronization signal comes from a defect or an intact integrated circuit if an already tested integrated circuit is used as the integrated reference circuit. Otherwise, if an untested integrated circuit is used as the integrated reference circuit, at least the expense is reduced to verifying a single integrated circuit in contrast with verifying a synchronization signal for each integrated circuit to be tested. On the whole, the test setup consequently is simplified with regard to both the number of pins needed and with regard to the protocol of the data transfer.

LIST OF REFERENCE NUMERALS

| List of reference numerals |
| --- |
| 10 integrated circuit to be tested |
| 12 integrated circuit to be tested |
| 14 integrated circuit to be tested |
| 16 integrated circuit to be tested |
| 18 integrated circuit to be tested |
| 20 integrated circuit to be tested |
| 22 integrated circuit to be tested |
| 24 integrated circuit to be tested |
| 26 integrated reference circuit |
| 28 test device |
| 30 test interface |
| 32 test interface |
| 34 test interface |
| 36 test interface |
| 38 test interface |
| 40 test interface |
| 42 test interface |
| 44 test interface |
| 46 test interface |
| 48 interface |

| -continued |
| --- |
| List of reference numerals |
| 50 processing means |
| 52 synchronization means |
| 300 integrated circuit to be tested |
| 302 integrated circuit to be tested |
| 304 integrated circuit to be tested |
| 306 integrated circuit to be tested |
| 308 integrated circuit to be tested |
| 310 integrated circuit to be tested |
| 312 integrated circuit to be tested |
| 314 integrated circuit to be tested |
| 316 test setup |
| 318 test interface |
| 320 test interface |
| 322 test interface |
| 324 test interface |
| 326 test interface |
| 328 test interface |
| 330 test interface |
| 332 test interface |
| 334 interface |
| 336 interface |
| 338 interface |
| 340 interface |
| 342 interface |
| 344 interface |
| 346 interface |
| 348 interface |

What is claimed is:

1. Method for simultaneous testing of a plurality of integrated circuits being equal in construction, at a testing device, each integrated circuit of the plurality of integrated circuits including a test mode, in which a test sequence is executed in the integrated circuits, and a pin for outputting test data produced in the test mode, the method comprising:
receiving the test data of the plurality of integrated circuits at a plurality of test interfaces of the testing device being connected with the pin of the plurality of integrated circuits;
receiving a synchronization signal, which is synchronous with the test sequence, at an interface of the testing device being connected to a synchronization interface of an integrated reference circuit, in which a test sequence is executed which is identical with the test sequence of the plurality of integrated circuits;
evaluating the test data of the plurality of integrated circuits in the testing device so as to test the plurality of integrated circuits; and
synchronizing the evaluation of the test data of the plurality of integrated circuits on the basis of the synchronization signal of the integrated reference circuit.

2. Device for simultaneous testing of a plurality of integrated circuits being equal in construction, each integrated circuit of the plurality of integrated circuits including a test mode, wherein a test sequence is executed in the integrated circuits, and a pin for outputting test data produced in the test mode, the device comprising:
a plurality of test interfaces adapted to be connected to the interface of the plurality of integrated circuits, for receiving the test data of the plurality of integrated circuits;
an interface adapted to be connected to a synchronization interface of an integrated reference circuit, wherein a test sequence is executed which is identical with the test sequence of the plurality of integrated circuits;

an evaluation device for evaluating the test data of the plurality of integrated circuits so as to test the plurality of integrated circuits; and synchronization device for synchronizing the evaluation device with regard to the evaluation of the test sequences being executed in the plurality of integrated circuits on the basis of the synchronization signal of the integrated reference circuit.

3. Device as claimed in claim 2, wherein the integrated reference circuit is an integrated circuit which is identical with the plurality of integrated circuits and which is checked for its functionality, both the integrated reference circuit and the plurality of integrated circuits including a synchronization pin for outputting a synchronization signal which is synchronous with the respective test sequence, and the device being adapted to be separated from the synchronization pins of the integrated circuits in the simultaneous testing of the plurality of integrated circuits.

4. Device as claimed in claim 2, further comprising:

a device for simultaneous activating of the test mode of the plurality of integrated circuits and of the integrated reference circuit, so that the test sequences are executed in a synchronous manner.

* * * * *